(12) United States Patent
Nakata et al.

(10) Patent No.: US 7,511,313 B2
(45) Date of Patent: Mar. 31, 2009

(54) ULTRAVIOLET RAY EMITTING ELEMENT PACKAGE

(75) Inventors: Shigenori Nakata, Kanagawa (JP); Katsuya Watanabe, Kanagawa (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 77 days.

(21) Appl. No.: 11/802,319

(22) Filed: May 22, 2007

(65) Prior Publication Data

US 2007/0267645 A1    Nov. 22, 2007

(30) Foreign Application Priority Data

May 22, 2006   (JP)  ............... 2006-141683

(51) Int. Cl.
     *H01L 29/26*     (2006.01)
(52) U.S. Cl. .......................................... 257/98; 257/79
(58) Field of Classification Search .................. 257/79, 257/98
See application file for complete search history.

(56) References Cited

U.S. PATENT DOCUMENTS 5,847,507 A   12/1998   Butterworth et al.
6,746,295 B2   6/2004   Sorg
6,759,803 B2   7/2004   Sorg
7,126,273 B2   10/2006   Sorg
2005/0023488 A1   2/2005   Katsuki

FOREIGN PATENT DOCUMENTS

JP    10-233532 A    9/1998
JP    2001-196644 A    7/2001

OTHER PUBLICATIONS

What's New, "The Luminescence wave length is the same as the mercury lamp Intensity $100_mW$ UV-LED," Nikken Electronics, pp. 28-29 (2002).

*Primary Examiner*—Douglas M Menz
(74) *Attorney, Agent, or Firm*—Rader, Fishman & Grauer, PLLC

(57) ABSTRACT

An ultraviolet ray emitting element package comprises a condenser lens, and an ultraviolet ray emitting element which is arranged approximately at a center and in a bottom side of the condenser lens and which is apart from a bottom of the condenser lens, wherein a refractive index difference reduction substance having an ultraviolet ray durability is filled in a gap formed by the ultraviolet ray emitting element and the bottom of the condenser lens.

8 Claims, 3 Drawing Sheets

ULTRAVIOLET RAY EMITTING ELEMENT PACKAGE

CROSS-REFERENCES TO RELATED APPLICATION

This application claims priority from Japanese Patent Application Serial No. 2006-141683 filed on May 22, 2006, the contents of which are incorporated herein by reference in its entirety.

TECHNICAL FIELD

Described herein is an ultraviolet rays ray emitting element package in which an ultraviolet rays light emitting element which emits ultraviolet rays, and a condenser lens which condenses the ultraviolet rays from this ultraviolet rays light emitting element are integrally formed.

BACKGROUND

The ultraviolet ray emitting element which irradiates ultraviolet rays in the range of the 300-400 nm (for example, the middle wavelength thereof is 365 nm), is used for a treatment for curing or drying an adhesive agent, a paint, ink, a resist, etc. which has sensitivity in this wavelength range, or conversely various treatments, such as a melting treatment, a softening treatment etc. For example, in a light emitting treatment for adhesion of a pickup lens for an optical disc, or adhesion of electronic parts to a substrate etc., it is necessary to irradiate light to a small spot, and in some of ultraviolet ray emitting apparatuses for performing such a treatment, light is irradiated to a fine spot by guiding, for example, ultraviolet rays from a ultraviolet rays light source by a light guiding fiber which is formed by bundling a plurality of optical fibers, or by condensing the ultraviolet rays from an ultraviolet rays light source so as to be a spot shape by a condenser lens.

In the conventional art, as an ultraviolet rays light source in such an ultraviolet ray emitting apparatus, for example, a discharge lamp, such as a xenon lamp or an extra-high pressure mercury lamp, has been used suitably. In recent years, however, an ultraviolet ray emitting apparatus using a light emitting diode element (it is hereafter called a "UV-LED".) as a light source has been proposed (for example, "Ultraviolet LED of 100 mW light output whose light emission wavelength is the same as that of a mercury lamp", Nikkei electronics, Oct. 21, 2002, and p. 28.) with developments of the light emitting diode element using light emitting material which can emit ultraviolet rays with a high output (for example, Japanese Laid Open Patent (Tokkai) No. 2005-015764).

In general, when a light emitting diode element (LED element) is used as a light source, in order to use light from an LED element efficiently, an LED element package is formed, for example, by integrating (packaging) such an LED element and a condenser lens or a structure component with a condensing action (for example, Japanese Laid Open Patent No. (Tokkai) 2001-196644 and Japanese Laid Open Patent (Tokuhyo) No. 2002-543594). Hereafter, with reference to FIG. 1, as disclosed in patent documents 2, the structure of an LED element package of Japanese Laid Open Patent No. (Tokkai) 2001-196644 is explained.

FIG. 7 is a schematic cross sectional view of the structure of a conventional LED element package. In FIG. 7, an LED element 51 emits light by supplying electric power, and this LED element 51 is arranged in a concave portion of a container 52 made of a liquid crystal polymer etc. Lead electrodes 53 and 54 which are connected to electrodes 51A and 51B of the LED element 51 respectively are provided on the container 52. Specifically, the lead electrodes 53 and 54 are exposed to the outside, at the bottom of the concave portion of the container 52, and are electrically connected to the electrodes 51A and 51B of the LED element 51 which is arranged in the container 52. The electrodes 51A and 51B of the LED element 51 may be connected to the respective lead electrodes 53 and 54 by, for example, a joining method using a wire bonding of gold wire, or a joining method using electric joint material, such as silver paste. The LED element 51 is sealed (molded) with translucency resin 55 which transmits light emitted from the LED element 51, so that protection against oxidation of the LED element 51 and protection from the outside thereof is provided. In this LED element package 50, the side face(s) of the concave portion of the container 52 has a light reflection face (slop) so as to spread toward the outside thereof. Furthermore, the outer surface (contour) of the translucent resin 55 is formed in convex shape, so that, due to the convex lens effect of the translucent resin 55, the condensing nature of the light emitted from the LED element 51 increases, and the light extraction efficiency of the LED element package 50 can be improved.

Moreover, an LED light emitting element package disclosed in Japanese Laid Open Patent No. Tokuhyo 2002-543594 has the structure in which a lens is provided independently. As shown in FIG. 1 or 2 of the Japanese Laid Open Patent, the LED element is molded with transparent resin material containing a converter for wavelength conversion, which is made of an epoxy resin. Further the condenser lens is provided on the transparent resin material, and the condenser lens is joined and fixed by the transparent resin material so as to be integrally formed therewith.

And, when carrying out packaging of the UV-LED element which emits ultraviolet rays, the above package structure (resin mold structure) cannot be used. Namely, the conventional translucent resin material used in order to mold the LED element in the above-mentioned package structure, deteriorates when ultraviolet rays (light with a wavelength of 380 nm or less) are irradiated thereon, so that the ultraviolet rays transmittance thereof gradually decreases with use, for example, becoming below a half thereof, and a stable ultraviolet ray output cannot be secured. Therefore, the packaging cannot be carried out by molding the UV-LED element with the conventional transparent resin material.

Japanese Laid Open Patent (Tokkaihei) No. 10-233532 discloses that, in order to solve the problem, while, for example, gas such as nitrogen etc. which ultraviolet rays tend to transmit is enclosed in a space where a UV-LED element which emits light including ultraviolet rays is arranged, a lens is made from quartz glass etc. having ultraviolet rays transparency, so that packaging of the UV-LED element is carried out.

SUMMARY

However, in such a package structure in which such gas (for example, nitrogen) is enclosed, it is revealed that the extraction efficiency of the ultraviolet rays from the UV-LED element decreases. That is, in the UV-LED element package, gas is enclosed in the space thereof in which a UV-LED element is arranged, the ultraviolet rays which are emitted from the light source of the UV-LED element (light emitting material) are transmitted in the enclosed gas, so as to enter into a lens. The light source of the UV-LED element has a light emission layer of, for example, a gallium nitride (GaN) and since, the refractive index of the light emission layer of this gallium nitride (GaN) and that of the gas (for example, nitrogen) enclosed therein, are different from each other, on the interface of the light emission layer of the gallium nitride (GaN), and the gas, light which is incident thereto at a certain incident angle which is the critical angle or more, is totally reflected. That is, all the light emitted from the light emission layer of the gallium nitride (GaN) is not extracted into the gas.

This phenomenon will be concretely explained with reference to FIG. 3. Since the refractive index of the light emission layer of the gallium nitride (GaN) which forms the light source of the UV-LED element is about 2.5, and the refractive index of nitrogen is about 1.0, the critical angle θ at which total reflection occurs on the interface of the light emission layer of the gallium nitride (GaN) and the nitrogen (θ' becomes 90 degrees) becomes 23.6 degrees. Namely, among the light emitted from the light emission layer of the gallium nitride (GaN) in the UV-LED element, only components of the light which fall within the range in which the plane angle θ with respect to an axis perpendicular to the UV-LED element is up to 23.6 degrees (the solid angle θ is 0.52 sr (steradian)) can be taken out in the nitrogen atmosphere. Therefore, the light components emitted with a spread of 23.6 degrees or more from the UV-LED element cannot be used. Moreover, as mentioned above, in the UV-LED element package, the package structure in which the molding is carried out by the conventional transparent resin material cannot be formed. When the light extraction efficiency at time the UV-LED element is molded with an epoxy resin is examined, since the refractive index of the epoxy resin is about 1.5, the critical angle θ at which total reflection occurs on the interface of the light emission layer of the gallium nitride (GaN) and the epoxy resin, becomes 36.9 degrees. That is, in the light emitted from the light emission layer of the gallium nitride (GaN) in the UV-LED element, components of the light falling within in the range in which the plane angle with respect to the axis perpendicular to the UV-LED element is up to 36.9 degrees (the solid angle phi is 1.26 sr) can be taken out in an epoxy resin. Considering that light is uniformly contained within each angle range, in the UV-LED element package, gas is enclosed in a space in which the UV-LED element is arranged, and the amount of light taken out from the UV-LED element into the nitrogen atmosphere, is only about 40% of the light which is taken out into the resin from the UV-LED element in case the molding is carried out with an epoxy resin.

As mentioned above, when the UV-LED element package is formed, the packaging by the resin molding is desirable from a viewpoint of the light extraction efficiency. However, in this case, it is required that (a) the refractive index be large with respect to the transparent resin material used in order to carry out the molding of the UV-LED element (have the refractive index close to that of the light emitting layer of a light emitting element), that (b) the degree of degradation due to irradiation of ultraviolet rays be small, and that (c) adhesive properties be high enough to certainly fix a lens to a frame. However, resin material which satisfies all the three conditions is not known In the above situations, the present ultraviolet rays emitting element package is equipped with a condenser lens, and has a novel structure capable of obtaining a stabilized output in which extraction efficiency of the ultraviolet rays from an ultraviolet rays emitting element is high.

The present ultraviolet ray emitting element package comprises a condenser lens, and an ultraviolet ray emitting element which is arranged approximately at a center and in a bottom side of the condenser lens and which is apart from a bottom of the condenser lens, wherein a refractive index difference reduction substance having an ultraviolet ray durability is filled in a gap formed by the ultraviolet ray emitting element and the bottom of the condenser lens.

The present ultraviolet ray emitting element package comprises an ultraviolet ray emitting element, a substrate on which the ultraviolet ray emitting element is disposed, electrodes which electrically connect the ultraviolet ray emitting element to an outside, a condensing lens which condenses ultraviolet rays emitted from the ultraviolet ray emitting element and is arranged so that a bottom face of the condensing lens is apart from the ultraviolet ray emitting element, a lens holding member provided on the substrate so as to surround a circumference of the ultraviolet ray emitting element, and a refractive index difference reduction layer which is made of a refractive index difference reduction substance having ultraviolet ray durability and is formed in a gap formed between the ultraviolet ray emitting element and the bottom face of the condensing lens.

In the ultraviolet ray emitting element package, the refractive index difference reduction substance may be silicone resin or fluorine system resin. Further, the refractive index difference reduction substance may be liquid.

In the ultraviolet ray emitting element, the lens holding member may have a refractive index difference reduction substance inlet and a refractive index difference reduction substance outlet which are connected to a sealed space in which the ultraviolet ray emitting element is provided.

In the present ultraviolet emitting element package, a gap between the condenser lens and the ultraviolet emitting element is filled up with a refractive index difference reduction substance whose refractive index is slightly different from that of the light emitting layer of the ultraviolet ray emitting element. Therefore, since the degree of a decline of the extraction angle of the ultraviolet rays resulting from the refractive index difference between the light emitting layer of an ultraviolet emitting element and the refractive index difference reduction substance, on the interface therebetween, can be controlled to be small, the ultraviolet rays irradiated from the ultraviolet ray emitting element can be efficiently taken out. Since the refractive index difference reduction substance is excellent in ultraviolet ray resistance, the degree of a decline in the transmittance with time due to irradiation of ultraviolet rays can be controlled to be small. Furthermore, by selecting material of the condenser lens, which is different from the refractive index difference reduction substance, it is possible to use it as a refractive index difference reduction substance, if the substance is excellent in ultraviolet ray resistance, even though it is difficult to form a lens shape, so that the ultraviolet ray emitting element package from which the stable ultraviolet ray output is obtained can be formed.

Moreover, since the thickness of the refractive index difference reduction substance with which the gap between a lens and an ultraviolet emitting element is filled up is small, even where the transmittance of the refractive index difference reduction substance decreases due to deterioration thereof resulting from irradiation of ultraviolet rays, the degree of the adverse effects can be made small.

Moreover, by using a resin material in liquid form as a refractive index difference reduction substance, the ultraviolet ray emitting element is cooled down during lighting so that overheating thereof can be prevented, and a decline in the luminous efficiency of the ultraviolet emitting ray element can be prevented.

BRIEF DESCRIPTION OF DRAWINGS

Other features and advantages of the present ultraviolet ray emitting element package will be apparent from the ensuing description, taken in conjunction with the accompanying drawings, in which.

DETAILED DESCRIPTION

Figure 1:
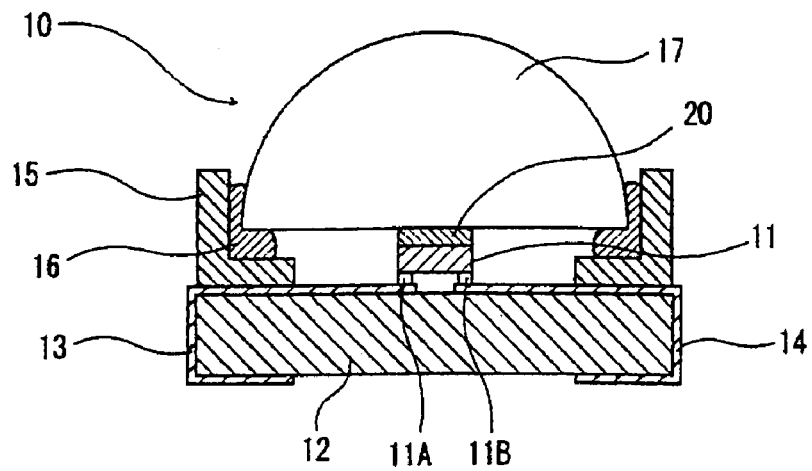
FIG. 1 is a schematic cross sectional view showing the structure of an example of an ultraviolet ray emitting element package according to an embodiment.

FIG. 1 is a schematic cross sectional view showing the structure of an example of an ultraviolet ray emitting element package according to an embodiment. This ultraviolet ray emitting element package 10 emits ultraviolet rays when electric power is supplied, in which, for example, an ultraviolet ray emitting element which is formed of an ultraviolet rays light emitting diode element (UV-LED element) 11 is arranged on a substrate 12. Furthermore, in front of the UV-LED element 11 in a light emitting direction (in FIG. 1, in an upper side), in a state where the bottom of a hemispherical condenser lens 17 which condenses the ultraviolet rays emitted from the UV-LED element 11, is away from the light emission face of the UV-LED element 11 so that a predetermined size of a gap is formed therebetween, and a hemispherical condenser lens 17 is held and fixed by a lens holding member 15, which is arranged so as to surround the circumference of the UV-LED element 11, and thereby, the UV-LED element 11 and the condenser lens 17 are integrally formed.

The UV-LED element 11 is located in the center of the condenser lens 17 in the bottom side thereof, and is electrically connected with the outside through lead electrodes 13 and 14 which are provided on the substrate 12. Electrodes 11A and 11B of the UV-LED element 11 are electrically connected to the lead electrodes 13 and 14 by, for example, electric joint material, such as a golden bump and silver paste. The light source (light emitting material) made of the UV-LED element 11 is formed by an active layer (whose refractive index is about 2.5) of, for example, a gallium nitride (GaN).

The condenser lens 17 is made of, for example, glass, such as quartz which does not deteriorate, due to transmission and irradiation of ultraviolet rays. In addition, as long as the condenser lens 17 has the above-mentioned property, it is not limited to glass, and may be formed by resin material.

The lens holding member 15 is, for example, a frame which is a L shape in a cross sectional view, and for example, the condenser lens 17 is fixed and held on a lens holding face thereof with an adhesive agent 16 applied thereon.

The present ultraviolet emitting element package has ultraviolet ray durability, and the refractive index difference reduction substance with the small difference from the light emitting layer of the UV-LED element in a refractive index is filled up in a space which includes at least the gap between the ultraviolet ray emitting element and the bottom of the condenser lens. In this embodiment, a refractive index difference reduction layer 20 is formed in a state where the refractive index difference reduction layer 20 which is made of the refractive index difference reduction substance is brought into close contact with both the condenser lens 17 and in the UV-LED element 11 in the gap between the UV-LED element 11 and the bottom of the condenser lens 17, that is, gas (air layer) does not exist (no gap exists) in an interface with the refractive index difference reduction layer 20, a lens 17, and the UV-LED element 11, or in the refractive index difference reduction layer 20 (in a thickness portion). When turning on electricity of the rated current to the UV-LED element 11 so as to operate the UV-LED element 11, the phrase "ultraviolet ray durability" used herein, means a property, in that a 70% fall (70% or more of transmittance at time of an early stage can be maintained) is guaranteed after a lapse of 5000 hours, that is, even if ultraviolet rays are irradiated, the transmittance thereof does not go down over a long time, or the degree of a decline in transmittance is small.

Although as the refractive index difference reduction substance 20, any substance can be used as long as it has the above-mentioned property, it is desirable that, for example, silicone resin or fluorine system resin be used. As silicone resin, for example, an addition type silicone resin is desirable. The fluorine system resin may be, for example, "CYTOP" (ASAHI GLASS CO., LTD.) which is amorphous fluorine polymer, or "OPTOOL" (DAIKIN INDUSTRIES, LTD) which is a fluororesin containing a silane coupling agent, etc. In the above example, the amorphous fluorine polymer can be preferably used since it does not deteriorate due to ultraviolet rays, and the fluororesin containing a silane coupling agent can be preferably used since it is excellent in adhesion with the glass which forms a lens.

The smaller the thickness of the refractive index difference reduction layer 20, the better. For example, the thickness thereof is 100 μm (micrometers) or less. Since even though the layer 20 deteriorates due to ultraviolet rays so that the transmittance thereof declines, it is possible to largely reduce the influence.

Since the adhesive agent 16 for fixing the condenser lens 17 is not directly exposed to ultraviolet rays from the UV-LED element 11, nor is the light incident in the adhesive agent 16 condensed, the adhesive agent 16 may be one that the transmittance thereof may fall due to ultraviolet rays. Although the adhesive agent 16 may be selected from those which have the adhesion force high enough to fix the condenser lens 17 to the lens holding member 15, it is desirable that one having properties set forth below be used as the adhesive agent 16, depending on the kind of refractive index difference reduction substance 20. When silicone resin is used as the refractive index difference reduction substance, if the silicone resin is exposed to the atmosphere for a long time, moisture and gas may permeate the silicone resin so that the UV-LED element 11 may deteriorate or the transmittance of the silicone resin itself may fall. Therefore, an adhesive agent in which adhesiveness thereof is good, namely, gas permeability thereof is low, and gas discharge speed is slow, is preferably used as the adhesive agent 16. For example, epoxy system resin may be used as the adhesive agent 16. Moreover, when fluorine system resin is used as the refractive index difference reduction substance, since the adhesion force (adhesibility) of fluororesin is weak, due to heat generation at the time of lighting of the UV-LED element 11, the refractive index difference reduction layer 20 and the condenser lens 17, or the UV-LED element 11 are separated, so that gas may enter between the refractive index difference reduction layer 20 and the condenser lens 17, or the UV-LED element 11. In order to ease the stress produced in the condenser lens 17 or the substrate 12 due to thermal expansion etc., an adhesive agent which has elasticity even after adhering, is preferably used as adhesives 16. For example, resin containing a silyl group can be selected as such an adhesive agent 16.

Figure 2:
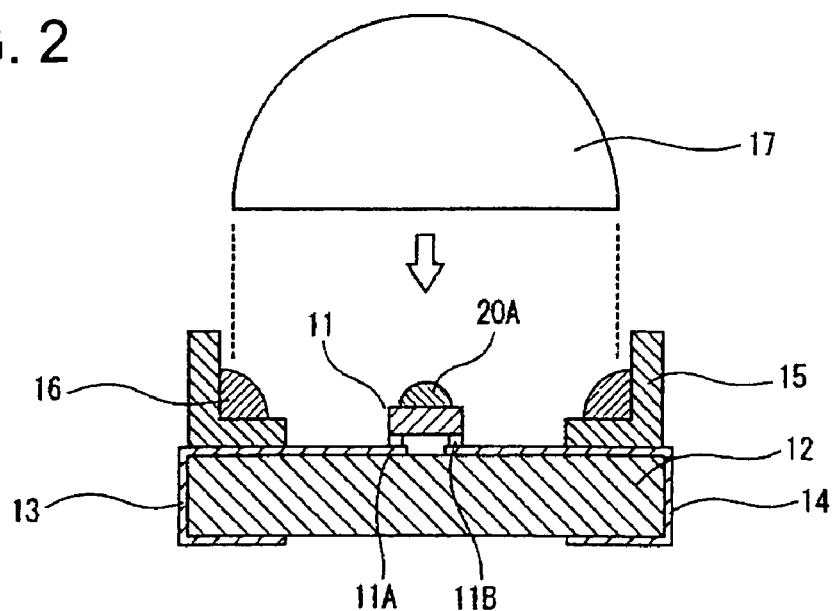
FIG. 2 is a diagram for explaining a production method of an ultraviolet ray emitting element package shown in FIG. 1.

The ultraviolet emitting element package 10 can be made as set forth below. Namely, as shown in FIG. 2, after mounting the UV-LED element 11 on the substrate 12 on which the lead electrodes 13 and 14 are disposed, a lens holding member 15 is fixed to a predetermined position thereof, and the refractive index difference reduction substance 20A which is in form of paste and has a viscosity adjusted to an appropriate value is applied to the light emission face of the UV-LED element 11. A proper quantity of the adhesive agent 16 is applied to the lens holding face of the lens holding member 15, and in this state, positioning of the condenser lens 17 to the UV-LED element 11 is carried out, so that the condenser lens 17 is arranged in an upper position of the UV-LED element 11. Thereby, while the air which is contained in refractive index difference reduction substance 20A, and the air between refractive index difference reduction substance 20A and the condenser lens 17 is removed by using the self-weight of the condenser lens 17, the refractive index difference reduction substance 20A spreads so as to cover the entire light emission face of the UV-LED element 11, so that a distance between the bottom of the condenser lens 17 and the UV-LED element 11, i.e., the thickness of the refractive index difference reduction layer is defined so as to have a predetermined thickness, whereby the refractive index difference reduction substance 20A, the condenser lens 17, and the UV-LED element 11 are brought into close contact respectively without any gap. And by hardening the refractive index difference reduction substance 20A and the adhesive agent 16, or only adhesive agent 16, the refractive index difference reduction layer 20 is formed between the condenser lens 17 and the UV-LED element 11, and further the circumferential edge of a condenser lens 17 is pasted up and fixed to the lens holding member 15 by the adhesive agent 16, so that the UV-LED element package 10 shown in FIG. 1 is formed.

In the structure of the UV-LED element package 10, the UV-LED element 11 emits light by supplying electric power through the lead electrodes 13 and 14, and the ultraviolet rays emitted from the UV-LED element 11 are transmitted through the thickness part of the refractive index difference reduction layer 20 so as to become incident in the condenser lens 17. Since in the UV-LED element package 10, the refractive index difference reduction layer 20 which is made of a refractive index difference reduction substance with the small difference in a refractive index from the light emitting layer of the UV-LED element 11 is filled up with and is formed in the gap between the condenser lens 17 and the UV-LED element 11, the degree of a decline of the extraction angle of the ultraviolet rays resulting from the difference of the refractive index on the interface between the light emitting layer of the UV-LED element 11 and the refractive index difference reduction substance 20 can be controlled to be small.

Figure 3:
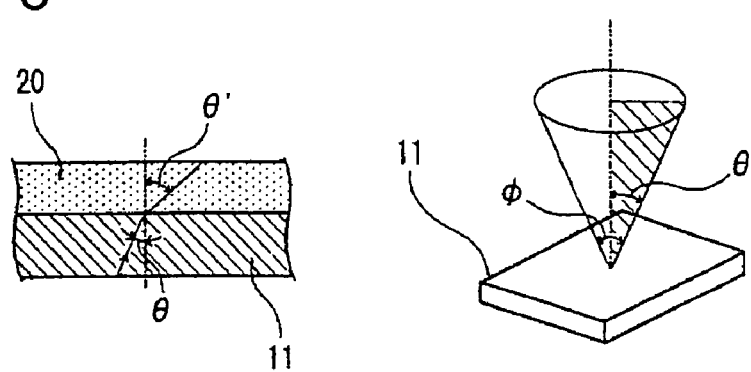
FIG. 3 is a diagram for explaining an effect of an ultraviolet ray emitting element package according to an embodiment.

Detailed explanation thereof will be given below, referring to FIG. 3. Among components of light emitted from the light emitting layer of, for example, gallium nitride (GaN), which forms the light source of the UV-LED element 11, light components in which a plane angle with respect to the axis perpendicular to the UV-LED element 11 falls within an angle range (solid angle $\phi$) which is a critical angle $\theta$ (in which the light is totally reflected ($\theta'$ becomes 90 degrees) on the interface of the light emission layer of the gallium nitride (GaN) and the refractive-index difference reduction layer 20), are taken out. However, when the refractive index difference reduction layer 20 is silicone resin, the refractive index of the light emitting layer of the gallium nitride (GaN) is about 2.5, and since the refractive index of silicone resin is about 1.45, the critical angle $\theta$ becomes 35.5 degrees, and the solid angle $\phi$ becomes 1.16 sr. Moreover, when the refractive index difference reduction layer 20 is a fluororesin, since the refractive index of the fluororesin is about 1.3, the critical angle $\theta$ becomes 31.3 degrees, and the solid angle $\phi$ becomes 0.92 sr. On the other hand, the solid angle $\phi$ is about 0.52 sr in the conventional package structure where a UV-LED element is arranged at nitrogen atmosphere, as mentioned above. Therefore the ultraviolet rays irradiated from the UV-LED element 11 according to the embodiment, can be taken out efficiently, as compared with the conventional package structure. That is, when silicone resin is used as the refractive index difference reduction substance, the ultraviolet rays can be taken out with about 2.2 times efficiency and when fluororesin is used, they are taken out with about 1.8 times efficiency. And when the refractive index difference reduction layer 20 is excellent in ultraviolet light resistance, the decline degree of the transmittance with time due to irradiation of ultraviolet rays can be controlled to be small, and expected performance can be certainly obtained over a long period of time.

Moreover, the condenser lens 17 does not need to be fixed by the adhesion force of the refractive index difference reduction substance in the UV-LED element package 10, and for example, since it may be pasted up with the adhesive agent 16 at the circumferential edge of the condenser lens 17, and held by and fixed to the lens holding member 15, the thickness of the refractive-index difference reduction layer 20 can be made small such as 100 µm (micrometers) or less, so that, even if the transmittance of the refractive index difference reduction layer 20 falls due to irradiation of ultraviolet rays, the degree of the influence can be made small.

Figure 4:
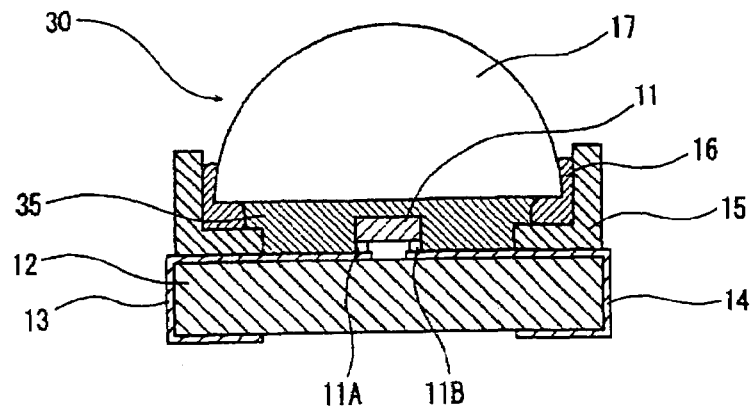
FIG. 4 is a schematic cross sectional view showing the structure of another example of an ultraviolet ray emitting element package according to an embodiment.

Although the embodiments are explained above, the present invention is not limited to thereto, and can make various change thereto. For example, as shown in FIG. 4, a package structure in which a liquid refractive index difference reduction substance 35 may be filled up in a sealed enclosed space including a gap between the lens 17 and the UV-LED element 11 can be adopted. Because the refractive index difference reduction substance 35 which is in form of liquid is used in the UV-LED element package 30, it is required that the space formed by the condenser lens 17, the lens holding member 15, and the substrate 12, where the refractive index difference reduction substance 35 is filled up, have the high sealing nature. For example, an adhesive agent having outstanding sealing nature is used as the adhesive agent 16 for fixing the condenser lens 17. Moreover, in addition to the above-mentioned characteristics, a substance having a high boiling point (for example, 200 degrees Celsius or more), is used as the liquid refractive index difference reduction substance 35. This is because the UV-LED element 11 may generate heat at the time of lighting, reaching for example, about 150 degrees Celsius, so that the ultraviolet rays from the UV-LED element 11 are reflected by air bubbles which are generated by boiling of the liquid refractive index difference reduction substance 35, and thereby the light use efficiency falls or the package is damaged.

Figure 5:
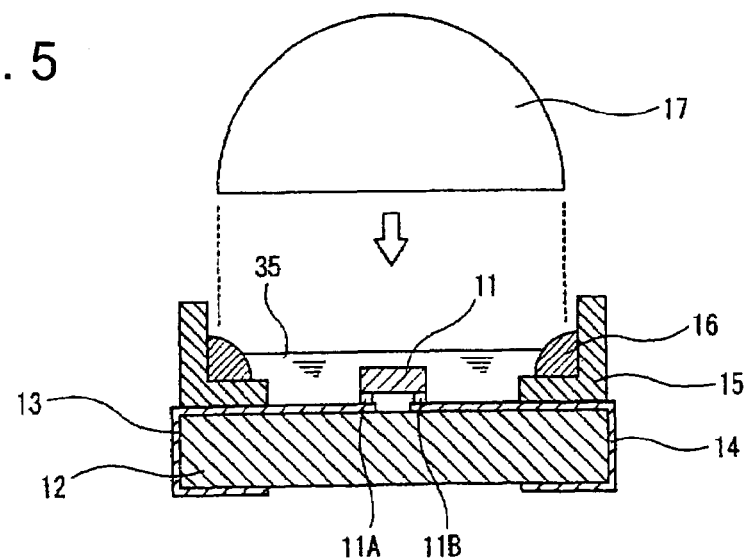
FIG. 5 is a diagram for explaining a production method of an ultraviolet ray emitting element package shown in FIG. 4.

In the UV-LED element package 30 having such a structure, as shown in FIG. 5, after mounting the UV-LED element 11 on the substrate 12 on which the lead electrodes 13 and 14 are disposed, the lens holding member 15 is fixed to a predetermined position thereof, and an appropriate quantity of the adhesive agent 16 is applied to the lens holding surface of the lens holding member 15. The liquid refractive index difference reduction substance 35 is poured therein so that the liquid surface thereof is located in a predetermined level with respect to the light emission face of the UV-LED element 11, thereby immersing the UV-LED element 11. In this state, the condenser lens 17 is positioned with respect to the UV-LED element 11, so that no gas (air) remains, and so that a distance between the bottom of the condenser lens 17 and the UV-LED element 11, i.e., the thickness of the refractive index difference reduction substance is defined so as to be a predetermined thickness. By hardening the adhesive agent 16, the circumferential edge of the lens 17 is pasted up and fixed to the lens holding member 15 with the adhesive agent 16, and, thereby, the UV-LED element package 30 shown in FIG. 4 is formed.

According to the above-mentioned UV-LED element package 30, it is possible to take out ultraviolet rays efficiently from the UV-LED element 11, that is, the same effect as what is shown in FIG. 1 can be obtained, and the degree of a decline in the transmittance with time due to irradiation of ultraviolet rays can be controlled small, so that the stable ultraviolet rays output can be certainly obtained over a long period of time.

Figure 6:
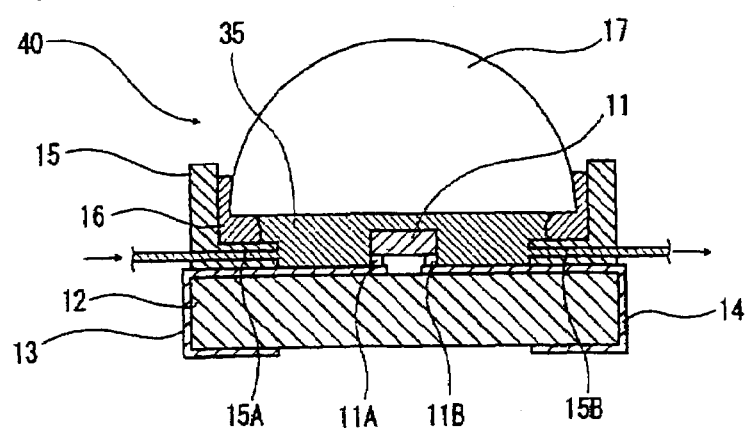
FIG. 6 is a schematic cross sectional view showing the structure of a still another example of an ultraviolet ray emitting element package according to an embodiment.
Figure 7:
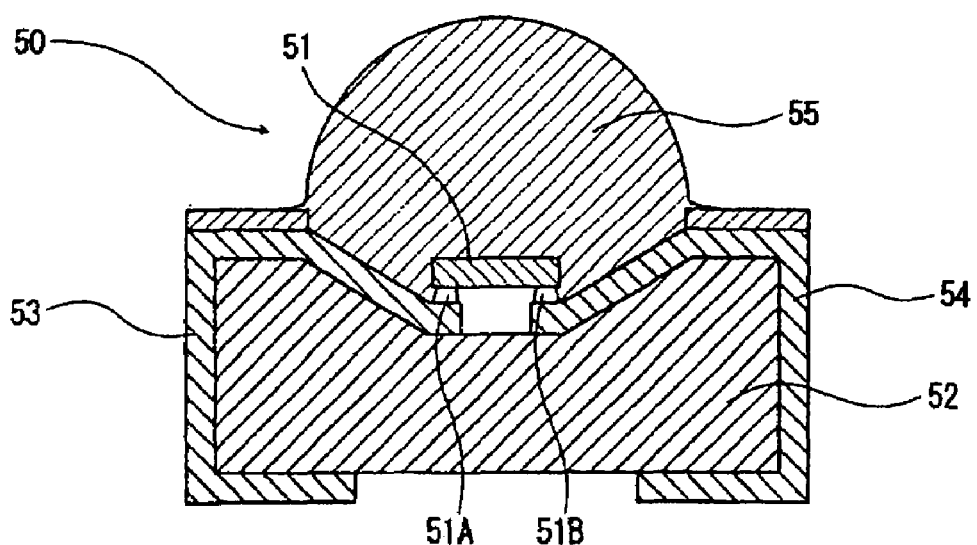
FIG. 7 is a schematic cross sectional view showing the structure of an example of a conventional LED element package.

Moreover, in the UV-LED element package having the structure in which the liquid refractive index difference reduction substance is filled up, as shown in FIG. 6, a refractive index difference reduction substance inlet 15A and a refractive index difference reduction substance outlet 15B which are connected to a sealed space in which the UV-LED element 11 is arranged, are provided in the lens holding member 15, so that the liquid refractive index difference reduction substance 35 may flow inside the sealed space. Thus, in the UV-LED element package 40 having such a structure, the UV-LED element 11 is turned on while the liquid refractive index difference reduction substance 35 pass therethrough. If the liquid refractive index difference reduction substance 35 is passed therethrough so as not to produce air bubbles, specific conditions of the amount of supply etc., are not restricted. According to the UV-LED element package 40 having such a structure, in addition to the above-mentioned effects, it is possible to certainly prevent the UV-LED element 11 from being overheated by passing the liquid refractive index difference reduction substance 35 therethrough so as to cool the UV-LED element 11, thereby preventing the luminous efficiency of the UV-LED element 11 from falling.

Furthermore, in the ultraviolet emitting element package having the structure shown in FIG. 1, the lens holding member can be eliminated, if the condenser lens can be certainly fixed with a proper posture, and a fixing method thereof with an adhesive agent is not restricted. Furthermore, the refractive index difference reduction substance may be filled up in the space where the UV-LED element is arranged.

As mentioned above, in the ultraviolet emitting element package according to an embodiment, while the ultraviolet rays irradiated from the ultraviolet ray emitting element can be efficiently taken out since the degree of a decline in the transmittance with time due to irradiation of the ultraviolet rays can be controlled to be small, for example, it will become very useful as a light source of an ultraviolet ray emitting apparatus for performing a light emitting treatment for adhesion of a pickup lens for an optical disc, or adhesion of electronic parts to a substrate, etc.

The preceding description has been presented only to illustrate and describe exemplary embodiments of the ultraviolet ray emitting element package according to the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. An ultraviolet ray emitting element package comprising:
a condenser lens; and
an ultraviolet ray emitting element which is arranged approximately at a center and in a bottom side of the condenser lens and which is apart from a bottom of the condenser lens,
wherein a refractive index difference reduction substance having an ultraviolet ray durability is filled in a gap formed by the ultraviolet ray emitting element and the bottom of the condenser lens.

2. The ultraviolet ray emitting element package according to claim 1, wherein the refractive index difference reduction substance is silicone resin or fluorine system resin.

3. The ultraviolet ray emitting element according to claim 2, wherein the refractive index difference reduction substance is liquid.

4. The ultraviolet ray emitting element according to claim 3, wherein the lens holding member has a refractive index difference reduction substance inlet and a refractive index difference reduction substance outlet which are connected to a sealed space in which the ultraviolet ray emitting element is provided.

5. An ultraviolet ray emitting element package comprising:
an ultraviolet ray emitting element;
a substrate on which the ultraviolet ray emitting element is disposed;
electrodes which electrically connect the ultraviolet ray emitting element to an outside;
a condensing lens which condenses ultraviolet rays emitted from the ultraviolet ray emitting element and is arranged so that a bottom face of the condensing lens is apart from the ultraviolet ray emitting element;
a lens holding member provided on the substrate so as to surround a circumference of the ultraviolet ray emitting element; and
a refractive index difference reduction layer which is made of a refractive index difference reduction substance having ultraviolet ray durability and is formed in a gap formed between the ultraviolet ray emitting element and the bottom face of the condensing lens.

6. The ultraviolet ray emitting element package according to claim 5, wherein the refractive index difference reduction substance is silicone resin or fluorine system resin.

7. The ultraviolet ray emitting element according to claim 6, wherein the refractive index difference reduction substance is liquid.

8. The ultraviolet ray emitting element according to claim 7, wherein the lens holding member has a refractive index difference reduction substance inlet and a refractive index difference reduction substance outlet which are connected to a sealed space in which the ultraviolet ray emitting element is provided.

* * * * *